(12) United States Patent
Sahoo

(10) Patent No.: US 10,587,299 B1
(45) Date of Patent: Mar. 10, 2020

(54) CONTROLLING TRANSMISSIONS MODE BASED ON TRACKED CUMULATIVE EMISSIONS AND PROXIMITY

(71) Applicant: CA, Inc., New York, NY (US)

(72) Inventor: Tapan Sahoo, Karnataka (IN)

(73) Assignee: CA, Inc., New York, NY (US)

( * ) Notice: Subject to any disclaimer, the term of this patent is extended or adjusted under 35 U.S.C. 154(b) by 0 days.

(21) Appl. No.: 16/145,319

(22) Filed: Sep. 28, 2018

(51) Int. Cl.
| | | |
|---|---|---|
| H04W 4/30 | (2018.01) | |
| H04W 88/02 | (2009.01) | |
| H04B 1/3827 | (2015.01) | |
| H01Q 1/24 | (2006.01) | |
| H04W 88/06 | (2009.01) | |
| H03K 17/955 | (2006.01) | |

(52) U.S. Cl.
CPC ........... *H04B 1/3838* (2013.01); *H01Q 1/245* (2013.01); *H03K 17/955* (2013.01); *H04W 88/06* (2013.01)

(58) Field of Classification Search
CPC ......... H04W 4/00; H04W 4/80; H04W 48/00; H04W 48/18
See application file for complete search history.

(56) References Cited

U.S. PATENT DOCUMENTS

| | | | | |
|---|---|---|---|---|
| 2011/0124363 A1* | 5/2011 | Calvarese | ............ | H04B 1/3838 455/522 |
| 2011/0159920 A1* | 6/2011 | Lehmann | ............. | H04B 1/3838 455/556.1 |
| 2013/0127670 A1* | 5/2013 | Desclos | ................. | H01Q 25/04 343/700 MS |
| 2013/0217450 A1* | 8/2013 | Kanj | ...................... | H01Q 1/242 455/575.7 |
| 2014/0128032 A1* | 5/2014 | Muthukumar | ........... | H01Q 3/00 455/411 |
| 2014/0370929 A1* | 12/2014 | Khawand | ............. | H04B 1/3838 455/522 |
| 2015/0295613 A1* | 10/2015 | Kim | ..................... | H04B 1/3838 455/550.1 |
| 2016/0157173 A1* | 6/2016 | Shen | ................... | H04W 52/146 370/311 |
| 2017/0265148 A1* | 9/2017 | Balasubramanian | ........................ | H04W 52/248 |
| 2017/0273033 A1* | 9/2017 | Lee | ..................... | H04W 52/283 |

\* cited by examiner

*Primary Examiner* — San Htun
(74) *Attorney, Agent, or Firm* — Kowert, Hood, Munyon, Rankin & Goetzel, P.C.

(57) ABSTRACT

A user equipment includes at least one transmitter, a processor, and a memory. The transmitter transmits RF communication signals through at least one antenna. The processor executes program code in the memory to perform operations. The operations include identifying occurrences of a user being proximately located to the at least one antenna during transmissions. The operations determine duration of the transmissions while the user continues to be identified as being proximately located to the at least one antenna, and generate a cumulative RF exposure metric based on the determined durations of the transmissions. The operations responsively initiate a RF exposure remedial action responsive to the cumulative RF exposure metric satisfying a defined rule. The user terminal may thereby operate to avoid unnecessary RF radiation exposure to a user when that exposure would reach an excessive level.

20 Claims, 6 Drawing Sheets

Decrease a duty cycle ratio of active transmission duration to inactive transmitter duration for transmission of traffic generated by an application being executed by the user equipment through the at least one transceiver — 900

*Figure 9*

Decrease a packet retransmission limit used to control a rate of traffic packet losses allowed for transmissions for a communication session through the at least one transceiver — 1000

*Figure 10*

While an audio stream is being provided through an ear speaker of the user equipment, display a message on a display device warning the user to switch to a Bluetooth headset to hear the ongoing audio stream — 1100

Route the audio stream through a Bluetooth transceiver for transmission to a Bluetooth headset and ceasing further routing of the audio stream through the ear speaker responsive to receiving a defined command from the user following display of the message — 1102

*Figure 11*

CONTROLLING TRANSMISSIONS MODE BASED ON TRACKED CUMULATIVE EMISSIONS AND PROXIMITY

FIELD OF THE INVENTION

The present disclosure relates to communication systems and, more particularly, to controlling transmissions from radio communication user equipments.

BACKGROUND

People are increasingly using many forms of radio communication user equipments to download and stream movies and television, communicate with others, download games and software applications, play on-line games, etc. The user equipments can be in many forms that include, without limitation, mobile phones, wireless data terminals, tablet computers, laptop computers, mobile gaming consoles, wireless access points (e.g., WiFi to cellular hotspots), etc. User equipments are being continually pushed to provide orders of magnitude faster communication bandwidth links than were available years earlier. Achieving such increases in bandwidth has been in-part by utilization of high-power transceivers connected to directional beamforming multiple-input multiple-output (MIMO) antennas which use higher RF frequency spectrum as a transmission medium. The presence of a passenger's head, hand, or other body part near one of these MIMO antennas can cause RF radiation pattern distortion or detuning of the antenna and absorption of the radiation, thus affecting the efficiency and correlation performance of the antenna. Moreover, the antennas can have deleterious effects on person's health. The World Health Organization (WHO) has classified the radiation generated by radio frequency (RF) transmitters as possibly carcinogenic. Other health concerns from such radiation can include triggering a person's electromagnetic hypersensitivity, cause thermal or heating effects to a passenger, cause loss of memory or other deleterious cognitive effects, and interfere with operation of a person's electro-medical device such as a pacemaker or hearing aid.

SUMMARY

Some embodiments of the present disclosure are directed to a user equipment that includes at least one transmitter, a processor, and a memory. The transmitter is configured to transmit RF communication signals through at least one antenna. The processor is coupled to communicate traffic through the at least one transmitter. The memory stores program code that is executable by the processor to perform operations. The operations include identifying occurrences of a user being proximately located to the at least one antenna during transmissions. The operations determine duration of the transmissions while the user continues to be identified as being proximately located to the at least one antenna, and generate a cumulative RF exposure metric based on the determined durations of the transmissions. The operations responsively initiate a RF exposure remedial action responsive to the cumulative RF exposure metric satisfying a defined rule.

In this manner, the user terminal can be configured to avoid unnecessary RF radiation exposure to a user when that exposure would reach an excessive level.

Corresponding operations by methods and computer program products are disclosed. Other methods, computer programs products, and user equipment according to embodiments will be or become apparent to one with skill in the art upon review of the following drawings and detailed description. It is intended that all such additional methods, computer program products, and user equipment be included within this description, be within the scope of the present inventive subject matter, and be protected by the accompanying claims. Moreover, it is intended that all embodiments disclosed herein can be implemented separately or combined in any way and/or combination.

BRIEF DESCRIPTION OF THE DRAWINGS

Other features of embodiments will be more readily understood from the following detailed description of specific embodiments thereof when read in conjunction with the accompanying drawings, in which:

FIGS. 2-11 are flowcharts of operations that can be performed by a user equipment in accordance with some embodiments of the present disclosure.

DETAILED DESCRIPTION

In the following detailed description, numerous specific details are set forth in order to provide a thorough understanding of embodiments of the present disclosure. However, it will be understood by those skilled in the art that the present invention may be practiced without these specific details. In other instances, well-known methods, procedures, components and circuits have not been described in detail so as not to obscure the present invention. It is intended that all embodiments disclosed herein can be implemented separately or combined in any way and/or combination.

Figure 1:
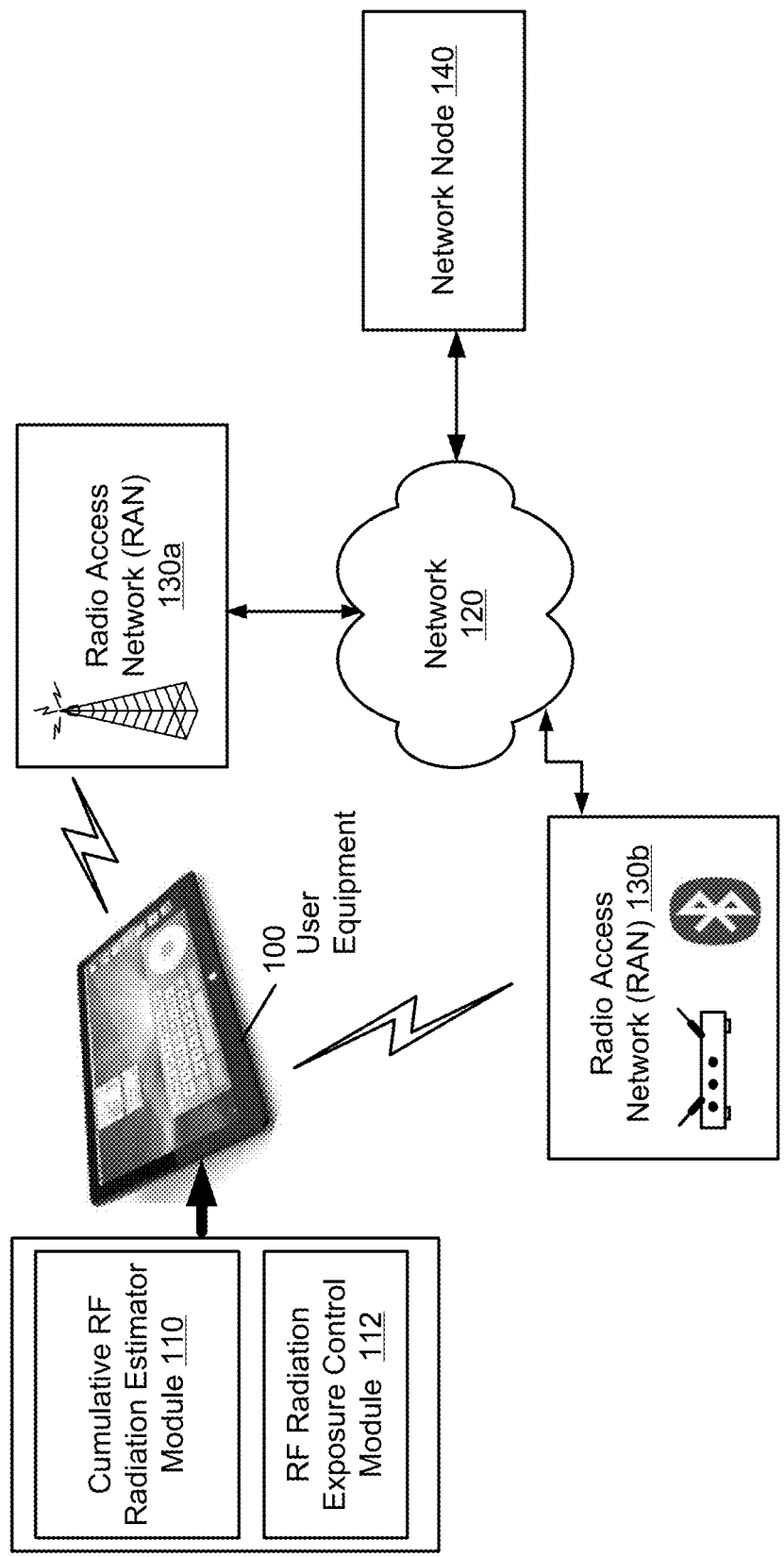
FIG. 1 is a block diagram of a wireless communications system that includes a user equipment which is configured to operate in accordance with some embodiments of the present disclosure.

FIG. 1 is a block diagram of a wireless communications system that includes a user equipment which is configured to operate in accordance with some embodiments of the present disclosure.

Referring to FIG. 1, the wireless communications system includes a user equipment (UE) 100 that communicates through RF signaling with one or more radio access networks 130*a* and 130*b* which interconnect the user equipment 100 through a wired network 120 (e.g., Internet and/or private network) with various network nodes 140.

The UE can include, without limitation, a mobile phone, a wireless data terminal, tablet computer, laptop computer, mobile gaming console, wireless access point (e.g., WiFi to cellular hotspots), etc. The network node 140 may be another UE, a communications network controller such as a cellular base station controller, and application server, etc.

Figure 12:
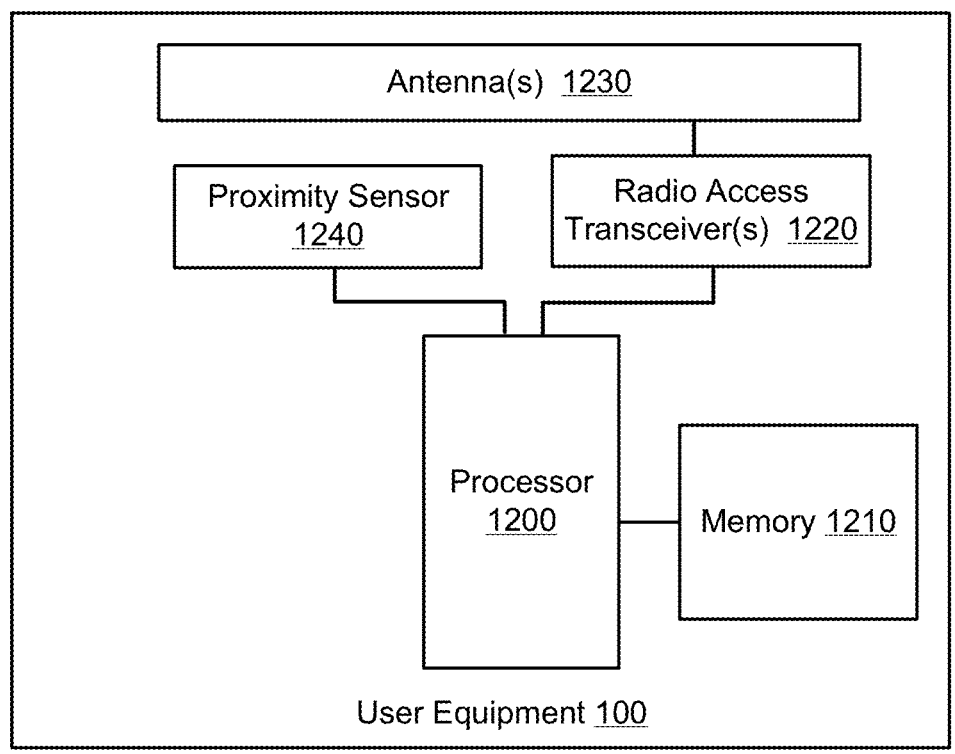
FIG. 12 is a block diagram of a user equipment having components that are configured to operate in accordance with some embodiments of the present disclosure.

The user equipment 100 includes at least one transmitter (e.g., radio access transceiver(s) 1220 in FIG. 12), a processor (e.g., processor 1200 in FIG. 12), and a memory (e.g. memory 1210 in FIG. 12). The at least one transmitter is configured to transmit RF communication signals through at least one antenna (e.g., Multiple Input Multiple Output (MIMO) antennas 1230 in FIG. 12). The processor is coupled to communicate traffic through the at least one transmitter. The memory stores program code that is executable by the processor to perform operations. The program code can include a cumulative RF radiation estimator module 110 that is configured to generate a cumulative RF exposure metric which provides an estimate of how much RF radiation exposure a user has experienced while operating the user equipment 100. The program code can further include a RF radiation exposure control module 112 that uses the cumulative RF exposure metric to determine when a remedial action should be performed to avoid or reduce the rate of accumulation of further RF radiation exposure to the user.

FIGS. 2-11 are flowcharts of operations that can be performed by the processor of the UE 100 via the modules 110 and 112.

Figure 2:
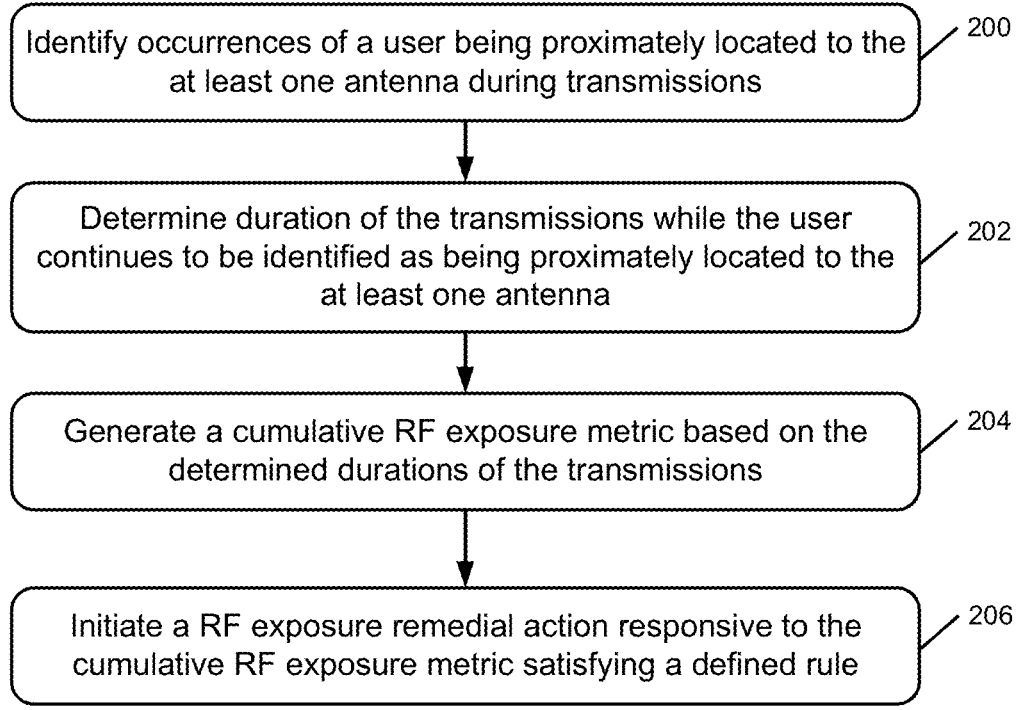

Referring to FIGS. 1 and 2, the operations include identifying 200 occurrences of a user being proximately located to the at least one antenna during transmissions. The operations determine 202 duration of the transmissions while the user continues to be identified as being proximately located to the at least one antenna, and generate 204 a cumulative RF exposure metric based on the determined durations of the transmissions. The operations responsively initiate 206 a RF exposure remedial action responsive to the cumulative RF exposure metric satisfying a defined rule.

In this manner, the UE can be configured to avoid unnecessary RF radiation exposure to a user when that exposure would reach an excessive level.

In one embodiment, the operation to determine duration of the transmissions while the user continues to be identified as being proximately located to the at least one antenna, can include accumulating a time duration in a counter while a communication session is ongoing that involves transmissions by the user equipment and while the user continues to be identified as being proximately located to the at least one antenna. The operations can pause accumulation of the time duration responsive to identifying occurrence of at least one of the user no longer being proximately located to the at least one antenna and the communication session being terminated. In this manner, the time duration indicates how much cumulative RF radiation exposure the user has experienced by being proximately located to the antennas during transmissions. The operation may be configured to track RF exposure as a rough approximation by determining how long a user remain proximately located to the UE 100 while a communication session is ongoing, were may track RF exposure by a higher accuracy approximation by determining for each transmission whether the user is presently located proximately to the user terminal 100 at the time of individual transmissions.

In one embodiment, the operations reset the time duration in the counter to a defined value responsive to determining that the RF exposure remedial action has been completed. Thus, for example, when the remedial action has instructing the user to switch from listening to an ongoing telephone conference via an ear speaker to instead using a Bluetooth headset or loudspeaker, the operations can reset the time duration in the counter to the defined value responsive to determining that the user has switched to the Bluetooth headset or loudspeaker and presumptively moved the UE 100 away from the user's head.

The operations to identify occurrences of the user being proximately located to the antennas during transmissions, can be performed responsive to input from a proximity sensor (e.g., sensor 1240 in FIG. 12). Various types of proximity sensors and associated operations are explained in the following nonlimiting embodiments.

In one embodiment, the UE 100 includes a touch sensitive display device and a proximity sensor that is to output a proximity signal indicating proximity of an object to the touch sensitive display. The proximity sensor may be configured to detect touch locations where user has touched the touch sensitive display and/or configured to detect that a user is hovering a finger near the touch sensitive display (e.g., sensing location of the hovering finger and/or sensing presence which may be used to wake-up the display). The operations performed by the processor identify occurrences of proximity of the user to the at least one antenna during transmissions responsive to the proximity signal.

In another embodiment, the UE 100 includes an orientation sensor that is used as a proximity sensor. The operations identify occurrences of proximity of the user to the at least one antenna during transmissions responsive to detecting an orientation of the user equipment which is determined to be characteristic of the user equipment being held adjacent to a head of the user. For example, when the UE 100 is determined to be held substantially vertically with the ear speaker upward, the operations can infer that the UE 100 is being held to the user's ear and resulting in relatively high RF radiation exposure to the user during transmissions by the UE 100.

In another embodiment, the UE 100 includes a camera that is used as a proximity sensor. The operations identify occurrences of proximity of the user to the at least one antenna during transmissions responsive to processing a video signal from the camera to determine that the user's face (e.g., identifiable features of the ear, eyes, hair, etc.) is within a threshold distance of the user equipment. For example, a digital video from a forward-facing camera can be analyzed to identify that the camera is positioned adjacent to the user's ear. Similarly, digital video from a rear-facing camera can be analyzed to identify that the top of the UE 100 is being held upward with an orientation that indicates that it is adjacent to the user's ear. Both of these determinations indicate to the operations that the user is experiencing a relatively high rate of RF radiation exposure during transmissions by the UE 100.

In another embodiment, the UE 100 includes an electrical capacitance sensor within a housing of the UE 100. The electrical capacitance sensor can be used as a proximity sensor. The electrical capacitance sensor can be configured to sense capacitive coupling to the user's body when closely spaced to the sensor. The sensor may therefore include a plate or other surface that is charged to generate an electric field, and a voltage sensor that determines when and/or how much coupling occurs between the electric field and a proximately located portion of the user's body. The operations identify occurrences of proximity of the user to the at least one antenna during transmissions responsive to determining from an output of the electrical capacitance sensor that the user's body is within a threshold distance of the electrical capacitance sensor.

Operations that can be performed by the UE 100 as RF exposure remedial actions will now described in the context of the following non-limiting embodiments. One or more of these RF exposure remedial actions can be performed responsive to the cumulative RF exposure metric being determined to satisfy a defined rule. The defined rule may be configured to limit a maximum amount of RF radiation exposure that a user can experience in a defined time period, during an ongoing communication session (e.g., teleconference, wireless on-line streaming music, wireless on-line gaming application, etc.), or according to another rule that may be generated or influenced by preferences that been input by the user and/or which may be determined by or preconfigured by an application (e.g., gaming application, teleconference application, music application, video application, streaming media application, etc.) that is executed by the UE 100.

Figure 3:
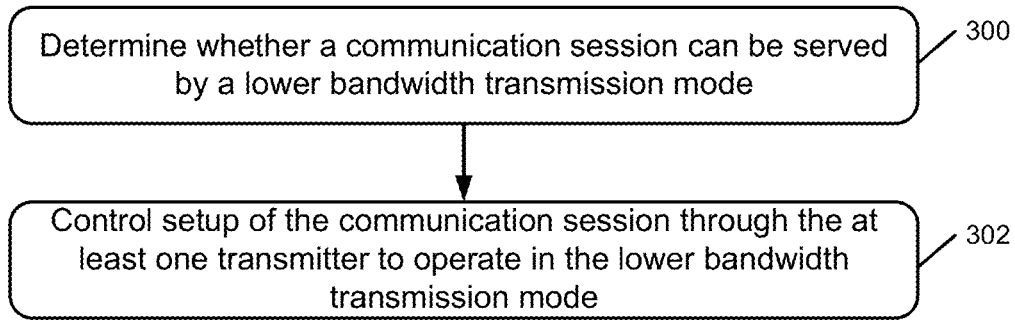

FIG. 3 illustrates a RF exposure remedial action that can be performed by the UE 100 responsive to the cumulative RF exposure metric being determined to satisfy the defined rule. Referring to FIG. 3, the operation of the RF exposure remedial action can include determining 300 whether a communication session can be served by a lower bandwidth transmission mode. Based on determining 300 that the communication session can be served by the lower bandwidth transmission mode, the operations can control 302 setup of the communication session through the at least one transmitter to operate in the lower bandwidth transmission mode. Thus, for example, while the RF exposure remedial action is active the operations can establish a new communication session to be constrained to a lower bandwidth transmission mode (e.g., lower transmission bandwidth data rate and/or lower frequency transmission traffic channel) then would otherwise be used for the new communication session when the RF exposure remedial action is not active.

The operation to determine whether a communication session can be served by a lower bandwidth transmission mode, can include identifying a plurality of bandwidth transmission modes that are available through the at least one transmitter, and selecting a lowest bandwidth one of the bandwidth transmission modes that satisfies a minimum bandwidth requirement defined for the communication session. The operation to control setup of the communication session through the at least one transmitter to operate in the lower bandwidth transmission mode, can include controlling the at least one transmitter to operate according to the bandwidth transmission mode that is selected.

Figure 4:
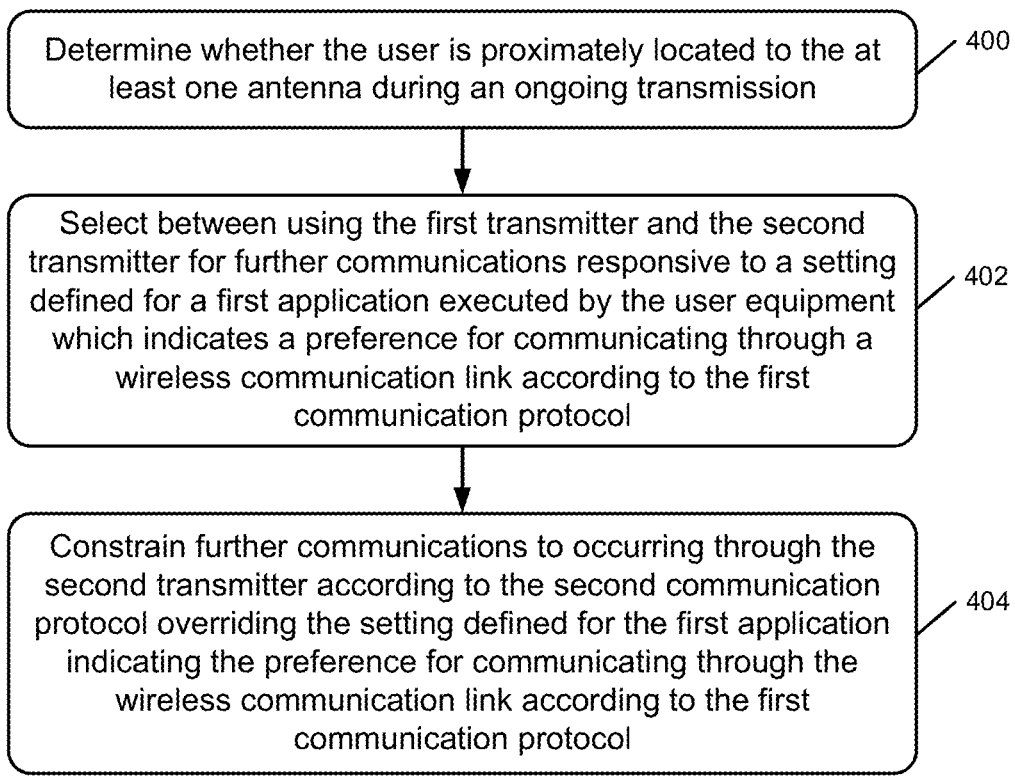

FIG. 4 illustrates another RF exposure remedial action that can be performed by the UE 100 responsive to the cumulative RF exposure metric being determined to satisfy the defined rule. The at least one transmitter of the UE 100 can include a first transmitter operating according to a first communication protocol and a second transmitter operating according to a second communication protocol that is different than the first communication protocol. The second transmitter operating according to the second communication protocol is constrained to transmitting RF signals at a lower power level than the first transmitter operating according to the first communication protocol.

Referring to FIG. 4, the operation of the RF exposure remedial action responsive to the cumulative RF exposure metric satisfying a defined rule, includes determining 400 whether the user is proximately located to the at least one antenna during an ongoing transmission. Based on determining 400 that the user is not proximately located to the at least one antenna during the ongoing transmission, the operations select 402 between using the first transmitter and the second transmitter for further communications responsive to a setting defined for a first application executed by the user equipment which indicates a preference for communicating through a wireless communication link according to the first communication protocol. Based on determining 400 that the user is proximately located to the at least one antenna during the ongoing transmission, the operations constrain 404 further communications to occurring through the second transmitter according to the second communication protocol overriding the setting defined for the first application indicating the preference for communicating through the wireless communication link according to the first communication protocol.

In a further embodiment, the first transmitter operates only according to a 3GPP cellular communication protocol, and the second transmitter operates only according to a 802.11 WiFi communication protocol or a Bluetooth communication protocol. The first transmitter operating according to a 3GPP cellular communication protocol generally emits much higher RF radiation (e.g., higher transmission power level and higher RF transmission RF spectrum) compared to the second transmitter operating according to the 802.11 WiFi communication protocol or Bluetooth communication protocol (e.g., much lower transmission power level and maybe also lower transmission RF spectrum).

In another further embodiment, the first transmitter operates according to a 3GPP 5G New Radio (NR) cellular communication protocol transmitting by parallel channels through a MIMO antenna array, and the second transmitter operates according to a 3GPP 4G cellular communication protocol. The first transmitter operating according to a NR cellular communication protocol generally emits much higher RF radiation (e.g., higher transmission power level and higher RF transmission RF spectrum with simultaneous traffic transmission streams through multiple antennas (MIMO antennas)) compared to the second transmitter operating according to the 4G communication protocol (e.g., lower transmission power level and maybe also lower transmission RF spectrum, and possibly only a single or fewer number of simultaneous traffic transmission streams through antennas).

Figure 5:
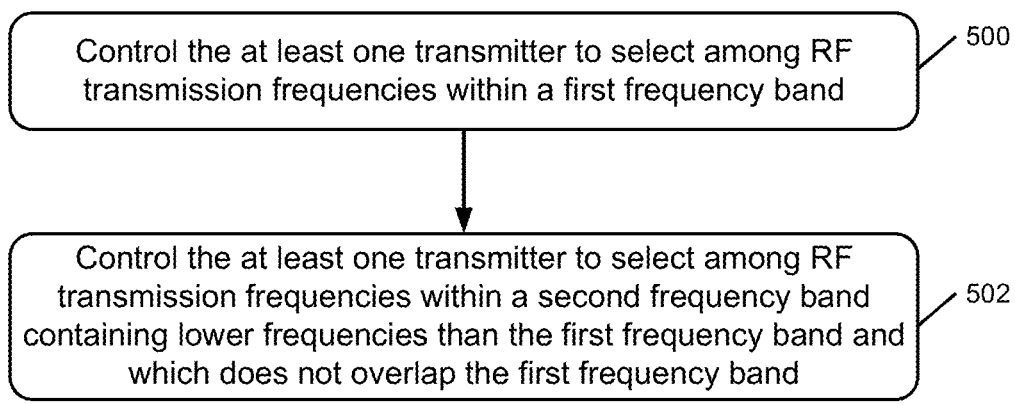

FIG. 5 illustrates a RF exposure remedial action that can be performed by the UE 100 responsive to the cumulative RF exposure metric being determined to satisfy the defined rule. Referring to FIG. 5, based on when a determination is made that the cumulative RF exposure metric does not satisfy the defined rule, the operations control 500 the at least one transmitter to select among RF transmission frequencies within a first frequency band. In contrast, based on when a determination is made that the cumulative RF exposure metric satisfies the defined rule, the operations control 502 the at least one transmitter to select among RF transmission frequencies within a second frequency band containing lower frequencies than the first frequency band and which does not overlap the first frequency band. The first frequency band having the higher RF frequency spectrum exposes the user to a higher risk of deleterious health effects compared to the second frequency band having a lower RF frequency spectrum. Accordingly, when the RF exposure remedial action is active the operations seek to utilize the second frequency band to reduce the RF radiation exposure to the user.

Figure 6:
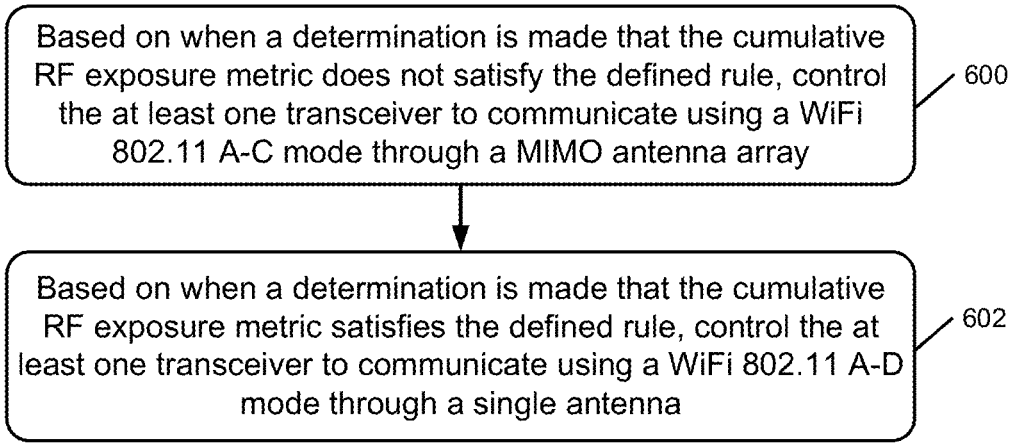

FIG. 6 illustrates a RF exposure remedial action that can be performed by the UE 100 responsive to the cumulative RF exposure metric being determined to satisfy the defined rule. Referring to FIG. 6, based on when a determination is made that the cumulative RF exposure metric does not satisfy the defined rule, the operations control 600 the at least one transceiver to communicate using a WiFi 802.11 A-C mode through a multiple-input multiple-output (MIMO) antenna array. In contrast, based on when a determination is made that the cumulative RF exposure metric satisfies the defined rule, operations control 602 the at least one transceiver to communicate using a WiFi 802.11 A-D mode through a single antenna. Accordingly, when the RF exposure remedial action is being performed the operations avoid use of the WiFi 802.11 A-C mode having transmissions through the MIMO antenna array, to reduce the intensity of the RF radiation exposure to the user.

Figure 7:
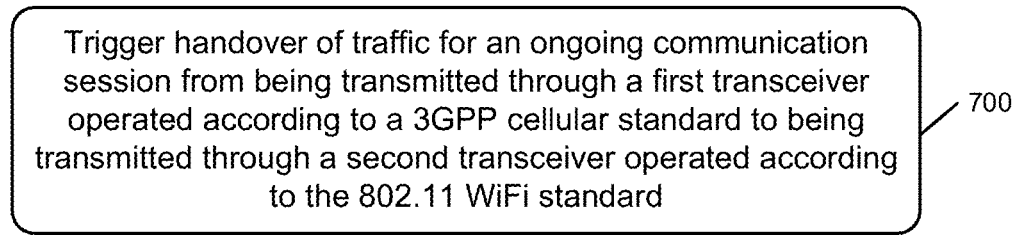

FIG. 7 illustrates a RF exposure remedial action that can be performed by the UE 100 responsive to the cumulative RF exposure metric being determined to satisfy the defined rule. Referring to FIG. 7, the operation to initiate a RF exposure remedial action responsive to the cumulative RF exposure metric satisfying a defined rule, can include triggering 700 handover of traffic for an ongoing communication session from being transmitted through a first transceiver operated according to a 3GPP cellular standard to being transmitted through a second transceiver operated according to the 802.11 WiFi standard. Handover from 3G PP cellular 2802.11 Wi-Fi can result in lowering the level of RF radiation signaling that the user is being exposed to during transmissions by the user equipment 100.

Figure 8:
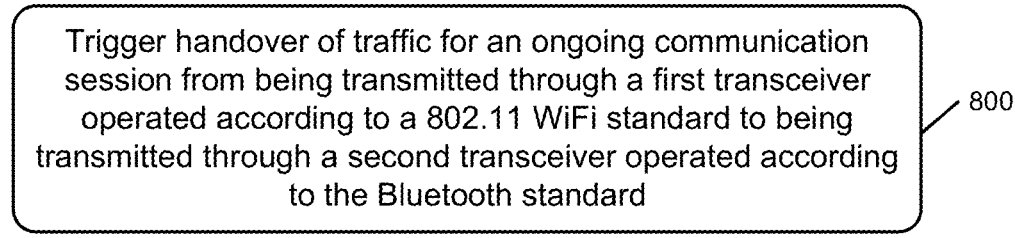

FIG. 8 illustrates a RF exposure remedial action that can be performed by the UE 100 responsive to the cumulative RF exposure metric being determined to satisfy the defined rule. Referring to FIG. 8, the operation to initiate a RF exposure remedial action responsive to the cumulative RF exposure metric satisfying a defined rule, can include triggering 800 handover of traffic for an ongoing communication session from being transmitted through a first transceiver operated according to the 802.11 WiFi standard to being transmitted through a second transceiver operated according to the Bluetooth standard. Handover from 802.11 WiFi to Bluetooth can substantially lower the level of RF radiation signaling that the user is being exposed to during transmissions by the user equipment 100.

FIG. 9 illustrates a RF exposure remedial action that can be performed by the UE 100 responsive to the cumulative RF exposure metric being determined to satisfy the defined rule. Referring to FIG. 9, the operation to initiate a RF exposure remedial action responsive to the cumulative RF exposure metric satisfying a defined rule, can include decreasing 900 a duty cycle ratio of active transmission duration to inactive transmitter duration for transmission of traffic generated by an application being executed by the user equipment through the at least one transceiver. Decreasing a duty cycle ratio so that the duration of transmissions is reduced can correspondingly reduce the RF radiation exposure to the user, however with a corresponding decrease in the transmission bandwidth capability, e.g., peak uplink communication bandwidth throttling, of the user equipment 100.

FIG. 10 illustrates a RF exposure remedial action that can be performed by the UE 100 responsive to the cumulative RF exposure metric being determined to satisfy the defined rule. Referring to FIG. 10, the operation to initiate a RF exposure remedial action responsive to the cumulative RF exposure metric satisfying a defined rule, can include decreasing 1000 a packet retransmission limit used to control a rate of traffic packet losses allowed for transmissions for a communication session through the at least one transceiver. Increasing the rate of transmission packet losses that is allowed for transmission can reduce the RF exposure to the user by allowing more data packets to be dropped without requesting retransmission of those data packets from another UE or RF network node, e.g., cellular radio base transceiver station (e.g., 3GPP eNB) or RF wireless access point.

FIG. 11 illustrates a RF exposure remedial action that can be performed by the UE 100 responsive to the cumulative RF exposure metric being determined to satisfy the defined rule. Referring to FIG. 11, the operation to initiate a RF exposure remedial action responsive to the cumulative RF exposure metric satisfying a defined rule, can include while an audio stream is being provided through an ear speaker of the user equipment, displaying 1100 a message on a display device warning the user to switch to a Bluetooth headset to hear the ongoing audio stream. The operations route 1102 the audio stream through a Bluetooth transceiver for transmission to a Bluetooth headset and ceasing further routing of the audio stream through the ear speaker responsive to receiving a defined command from the user following display of the message. Accordingly, warning the user to switch from using an ear speaker to Bluetooth can substantially reduce the RF radiation exposure during RF transmitter operation of the user terminal.

Example User Equipment

FIG. 12 is a block diagram of a user equipment 100 that is configured to operate according to some embodiments of the present disclosure. The UE 100 includes a processor 1200, a memory 1210, at least one radio access transceiver 1220, a proximity sensor 1240, and at least one antenna 1230. For example, the radio access transceiver 1220 can include a plurality of transceivers. One or more of the transceivers may be configured to communicate through one or more 3G PP cellular communication protocols that can include 3G, 4G, 5G (New Radio), etc. Another one or more the transceivers can be configured to communicate according to one or more 802.11 WiFi communication protocols that can include 802.11 A-D, 801.11 A-C, 802-11 A-B, etc. Another one or more the transceivers configured to communicate according to the Bluetooth communication protocol. The at least one antenna 1230 may include a MIMO antenna and one or more other antennas that can be configured to operate in various non-overlapping frequency bands that can include, without limitation, a frequency band including 60 GHz, another frequency band including 5 GHz, and another frequency band including 2 GHz.

The processor 1200 may include one or more data processing circuits, such as a general purpose and/or special purpose processor (e.g., microprocessor and/or digital signal processor) that may be collocated or distributed across one or more networks. The processor 1200 is configured to execute computer program code in the memory 1210, described below as a non-transitory computer readable medium, to perform at least some of the operations described herein as being performed by an access control computer. The computer program code when executed by the processor 1200 causes the processor 1200 to perform operations in accordance with one or more embodiments disclosed herein for the UEs disclosed herein. The UE 100 may further include a user input interface (e.g., touch screen, keyboard, keypad, etc.) and a display device.

The proximity sensor 1240 may include an orientation sensor, a camera, an electrical capacitance sensor, a sensor configured with a touch sensitive display device, and/or another type of sensor that can operate according to one or more of the various embodiments disclosed herein to identify occurrences of the user being proximately located to the antenna 1230, which can be inferred by determining when the user is detected as being proximately located to the UE 100.

Further Definitions and Embodiments

In the above-description of various embodiments of the present disclosure, aspects of the present disclosure may be illustrated and described herein in any of a number of patentable classes or contexts including any new and useful process, machine, manufacture, or composition of matter, or any new and useful improvement thereof. Accordingly, aspects of the present disclosure may be implemented in entirely hardware, entirely software (including firmware, resident software, micro-code, etc.) or combining software and hardware implementation that may all generally be referred to herein as a "circuit," "module," "component," or "system." Furthermore, aspects of the present disclosure may take the form of a computer program product comprising one or more computer readable media having computer readable program code embodied thereon.

Any combination of one or more computer readable media may be used. The computer readable media may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an appropriate optical fiber with a repeater, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB.NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

It is to be understood that the terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

The flowchart and block diagrams in the figures illustrate the architecture, functionality, and operation of possible implementations of systems, methods, and computer program products according to various aspects of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular aspects only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Like reference numbers signify like elements throughout the description of the figures.

The corresponding structures, materials, acts, and equivalents of any means or step plus function elements in the claims below are intended to include any disclosed structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The aspects of the disclosure herein were chosen and described in order to best explain the principles of the disclosure and the practical application, and to enable others of ordinary skill in the art to understand the disclosure with various modifications as are suited to the particular use contemplated.

The invention claimed is:

1. An apparatus, comprising:
one or more processors configured to communicate via at least one radio frequency (RF) transmitter and at least one antenna; and
one or more memories having program instructions stored thereon that are executable by the one or more processors to perform operations comprising:
identifying occurrences of a user being proximately located to the at least one antenna during transmissions;
determining durations of one or more of the occurrences;
generating a cumulative RF exposure metric based on the determined durations; and
initiating a RF exposure remedial action responsive to the cumulative RF exposure metric satisfying a defined rule;
wherein the apparatus is configured to communicate according to first and second different communication protocols via the at least one RF transmitter, wherein the first and second communication protocols have different transmit power characteristics; and
wherein the apparatus is configured to use the first communication protocol for a first application based on a first parameter for the first application, and wherein the remedial action includes overriding the first parameter and switching from the first communication protocol to the second communication protocol for the first application.

2. The apparatus of claim 1, wherein the operation to determine duration of the transmissions comprises:
accumulating a time duration in a counter while a communication session is ongoing that involves transmissions by the apparatus and while the user continues to be identified as being proximately located to the at least one antenna, and pausing accumulation of the time duration responsive to identifying occurrence of at least one of the user no longer being proximately located to the at least one antenna and the communication session being terminated.

3. The apparatus of claim 2, further comprising:
resetting the time duration in the counter to a defined value responsive to determining that the RF exposure remedial action has been completed.

4. The apparatus of claim 1, further comprising:
a touch sensitive display device; and
a proximity sensor configured to output a proximity signal indicating proximity of an object to the touch sensitive display,
wherein the apparatus is configured to identify occurrences of proximity of the user to the at least one antenna during transmissions responsive to the proximity signal.

5. The apparatus of claim 1, further comprising:
an orientation sensor; and
wherein the apparatus is configured to identify occurrences of proximity of the user to the at least one antenna during transmissions responsive to detecting an orientation of the apparatus which is determined to be characteristic of the apparatus being held adjacent to a head of the user.

6. The apparatus of claim 1, further comprising:
a camera,
wherein the apparatus is configured to identify occurrences of proximity of the user to the at least one antenna during transmissions responsive to processing a video signal from the camera to determine that the user's face is within a threshold distance of the apparatus.

7. The apparatus of claim 1, further comprising:
an electrical capacitance sensor within a housing of the apparatus,
wherein the apparatus is configured to identify occurrences of proximity of the user to the at least one antenna during transmissions responsive to determining from an output of the electrical capacitance sensor that the user's body is within a threshold distance of the electrical capacitance sensor.

8. The apparatus of claim 1, wherein the operation to initiate the RF exposure remedial action comprises:
determining whether a communication session can be served by a lower bandwidth transmission mode; and
based on determining that the communication session can be served by the lower bandwidth transmission mode, controlling setup of the communication session through the at least one transmitter to operate in the lower bandwidth transmission mode.

9. The apparatus claim 8, wherein:
the operation to determine whether a communication session can be served by a lower bandwidth transmission mode, comprises identifying a plurality of bandwidth transmission modes that are available through the at least one transmitter, and selecting a lowest bandwidth one of the bandwidth transmission modes that satisfies a minimum bandwidth requirement defined for the communication session; and
the operation to control setup of the communication session through the at least one transmitter to operate in the lower bandwidth transmission mode, comprises controlling the at least one transmitter to operate according to the bandwidth transmission mode that is selected.

10. The apparatus of claim 1, further comprising:
a first transmitter configured to operate according to the first communication protocol and a second transmitter configured to operate according to the second communication protocol that is different than the first communication protocol.

11. The apparatus of claim 10, wherein:
the first transmitter operates only according to a 3GPP cellular communication protocol; and
the second transmitter operates only according to a 802.11 WiFi communication protocol or a Bluetooth communication protocol.

12. The apparatus of claim 10, wherein:
the first transmitter operates according to a 3GPP 5G New Radio (NR) cellular communication protocol transmitting by parallel channels through a MIMO antenna array; and
the second transmitter operates according to a 3GPP 4G cellular communication protocol.

13. The apparatus of claim 1, wherein the operation to initiate a RF exposure remedial action responsive to the cumulative RF exposure metric satisfying a defined rule, comprises:
in response to a determination that the cumulative RF exposure metric does not satisfy the defined rule, controlling the at least one transmitter to select among RF transmission frequencies within a first frequency band; and
in response to a determination that the cumulative RF exposure metric satisfies the defined rule, controlling the at least one transmitter to select among RF transmission frequencies within a second frequency band containing lower frequencies than the first frequency band and which does not overlap the first frequency band.

14. The apparatus of claim 1, wherein the operation to initiate a RF exposure remedial action responsive to the cumulative RF exposure metric satisfying a defined rule, comprises:
in response to a determination that the cumulative RF exposure metric does not satisfy the defined rule, controlling the at least one transmitter to communicate using a WiFi 802.11 A-C mode through a multiple-input multiple-output (MIMO) antenna array; and
in response to a determination that the cumulative RF exposure metric satisfies the defined rule, controlling the at least one transmitter to communicate using a WiFi 802.11 A-D mode through a single antenna.

15. The apparatus of claim 1, wherein the operation to initiate a RF exposure remedial action responsive to the cumulative RF exposure metric satisfying a defined rule, comprises:
triggering handover of traffic for an ongoing communication session from being transmitted through a first transmitter operated according to a 3GPP cellular standard to being transmitted through a second transmitter operated according to an 802.11 WiFi standard.

16. The apparatus of claim 1, wherein the operation to initiate a RF exposure remedial action responsive to the cumulative RF exposure metric satisfying a defined rule, comprises:
triggering handover of traffic for an ongoing communication session from being transmitted through a first transmitter operated according to an 802.11 WiFi standard to being transmitted through a second transmitter operated according to a Bluetooth standard.

17. The apparatus of claim 1, wherein the operation to initiate a RF exposure remedial action responsive to the cumulative RF exposure metric satisfying a defined rule, comprises:
decreasing a duty cycle ratio of active transmission duration to inactive transmitter duration for transmission of traffic generated by an application being executed by the apparatus through the at least one transmitter.

18. The apparatus of claim 1, wherein the operation to initiate a RF exposure remedial action responsive to the cumulative RF exposure metric satisfying a defined rule, comprises:
decreasing a packet retransmission limit used to control a rate of traffic packet losses allowed for transmissions for a communication session through the at least one transmitter.

19. The apparatus of claim 1, wherein the operation to initiate a RF exposure remedial action responsive to the cumulative RF exposure metric satisfying a defined rule, comprises:
while an audio stream is being provided through an ear speaker of the apparatus, displaying a message on a display device warning the user to switch to a Bluetooth headset to hear the audio stream; and
routing the audio stream through a Bluetooth transceiver for transmission to a Bluetooth headset and ceasing further routing of the audio stream through the ear speaker responsive to receiving a defined command from the user following display of the message.

20. A non-transitory computer-readable medium having instructions stored thereon that are executable by a computing device to perform operations comprising:
identifying occurrences of a user being proximately located to at least one antenna of the computing device during transmissions by at least one transmitter of radio frequency (RF) communication signals through the at least one antenna;
determining durations of one or more of the occurrences;
generating a cumulative RF exposure metric based on the determined durations; and
initiating a RF exposure remedial action responsive to the cumulative RF exposure metric satisfying a defined rule;
wherein the computing device is configured to communicate according to first and second different communication protocols via the at least one RF transmitter, wherein the first and second communication protocols have different transmit power characteristics;
wherein the operations further comprise using the first communication protocol for a first application based on a first parameter for the first application, and wherein the remedial action includes overriding the first parameter and switching from the first communication protocol to the second communication protocol for the first application.

* * * * *